United States Patent [19]
Cleveland et al.

[11] Patent Number: 5,365,484
[45] Date of Patent: Nov. 15, 1994

[54] INDEPENDENT ARRAY GROUNDS FOR FLASH EEPROM ARRAY WITH PAGED ERASE ARCHITECHTURE

[75] Inventors: Lee E. Cleveland, Santa Clara; Michael A. Van Buskirk, San Jose; Johnny C. Chen, Cupertino; Chung K. Chang, Sunnyvale, all of Calif.

[73] Assignee: Advanced Micro Devices, Inc., Sunnyvale, Calif.

[21] Appl. No.: 109,887

[22] Filed: Aug. 23, 1993

[51] Int. Cl.⁵ ............................................... G11C 13/00
[52] U.S. Cl. .................................... 365/218; 365/185; 365/900
[58] Field of Search ...................... 365/185, 900, 218

[56] References Cited

U.S. PATENT DOCUMENTS 5,077,691  2/1991  Haddad et al. .................... 365/218
5,282,170  1/1994  Van Buskirk et al. ............. 365/226

Primary Examiner—Eugene R. LaRoche
Assistant Examiner—Do Hyum Yoo
Attorney, Agent, or Firm—Davis Chin

[57] ABSTRACT

An improved architecture for an array of flash EEPROM cells with paged erase is provided. The array is formed of a plurality of half-sectors. In each sector, the sources of the memory cell transistors are connected to a separate individual ground line. A ground line circuit is provided for generating a half-sector ground line signal. The separate individual ground line is connected to the ground line circuit for receiving the half-sector ground line signal which is at a predetermined positive potential during erase.

20 Claims, 3 Drawing Sheets

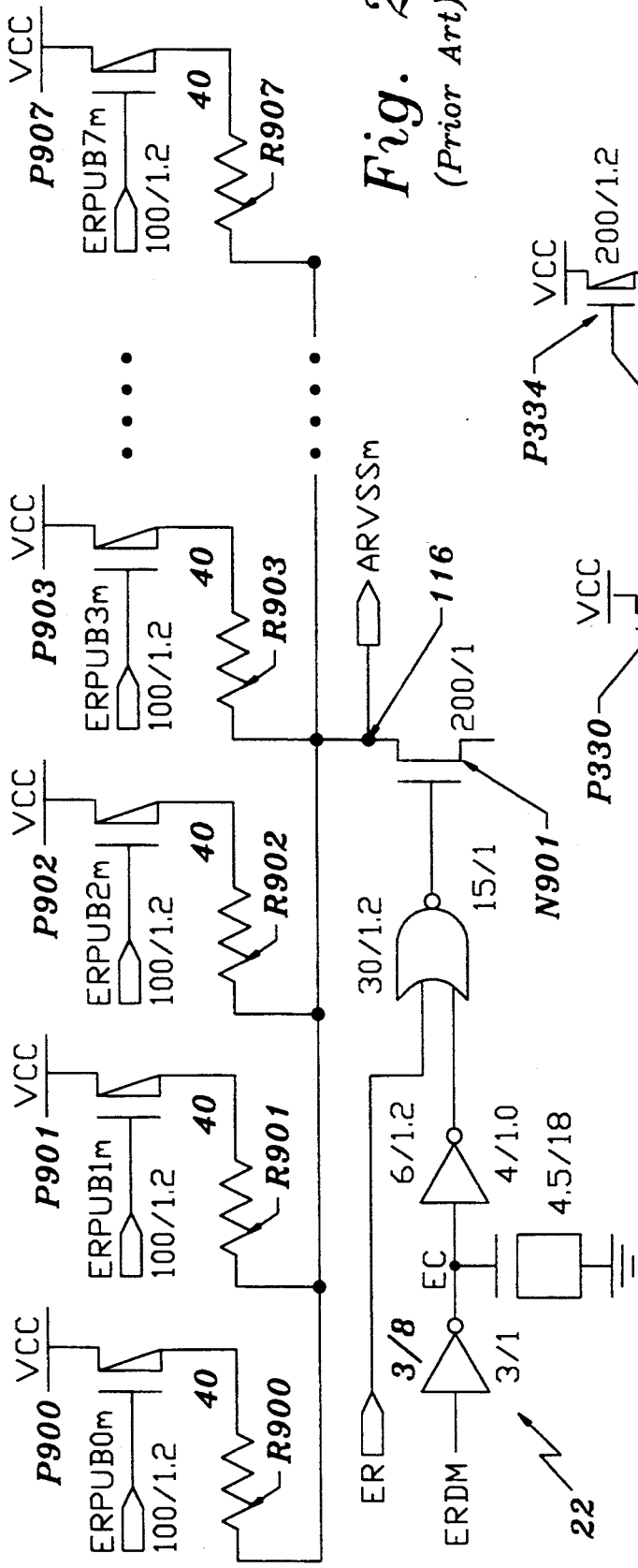
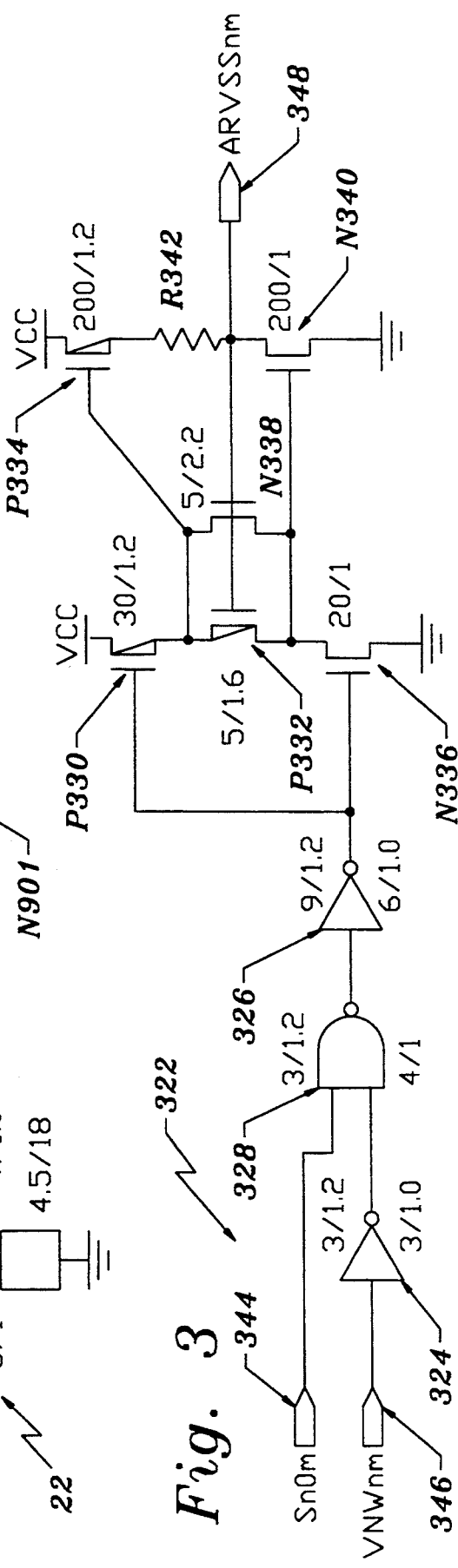
Fig. 2 (Prior Art)
Fig. 3

INDEPENDENT ARRAY GROUNDS FOR FLASH EEPROM ARRAY WITH PAGED ERASE ARCHITECHTURE

BACKGROUND OF THE INVENTION

1. Field of the Invention

This invention relates generally to floating gate memory devices such as an array of flash electrically erasable programmable read-only memory (EEPROM) cells with paged erase architecture. More particularly, the present invention relates to an improved architecture for an array of flash EEPROM cells with paged erase which includes multiple independent array ground circuits so as to provide greater endurance as well as enhanced performance.

2. Description of the Prior Art

In U.S. Pat. No. 5,077,691 to Sameer S. Haddad et al. issued on Dec. 31, 1991, there is disclosed a flash EEPROM array which has a negative gate voltage erase operation. The '691 patent is assigned to the same assignee as in the present invention and is hereby incorporated by reference in its entirety. One of the advantages obtained by applying a negative erase voltage through the wordlines to the control gates rather than applying a positive erase voltage through the source common line to the source regions of all memory cells in the flash EEPROM simultaneously is that erasure can be made to occur selectively on a row-by-row basis rather than having to erase all the memory cells of a chip simultaneously. Preferably, groups of rows are formed such that each group defining a sector provides a page-selectable erase block. For example, the memory array consisting of a large number, $N \times M$ (i.e., 1,000 or more) of such memory cells are typically formed on a single integrated circuit chip in an $N \times M$ matrix form, where N equals the number of columns and M equals the number of rows. If the matrix is assumed to have 1 million cells (i.e., $1024 \times 1024$), then groups of 128 rows each could be formed together so as to divide the matrix into eight sectors. Further, each of the sectors may be divided into two segments (left sector and right sector). Thus, the memory array could be typically formed of 16 half-sectors. Hence, the memory array could be erased selectively half-sector by half-sector for any given number of half-sectors rather than all memory cells being erased simultaneously.

In U.S. Pat. No. 5,126,808 to Antonio J. Montalvo et al. issued on Jun. 30, 1992, there is disclosed a flash EEPROM array with paged erase architecture. This '808 patent is assigned to the same assignee as in the present invention and is also hereby incorporated by reference in its entirety. With this paged erase architecture, during an erasure of a page a relatively high negative potential of $-12$ volts was applied to all of the control gates of the transistor cells via the word lines of the selected page for several hundred milliseconds. Further, the source regions of the transistor cells in the selected page were raised to a positive voltage of approximately $+5.0$ volts, and the drain regions thereof were allowed to float. Alternatively, the negative voltage could be applied to only a single word line in the selected page so as to selectively erase a single row. For all of the non-selected pages, the wordlines have 0 volts applied thereto. The problem encountered by this prior art architecture is that the transistor cells in the non-selected pages are still disturbed during the erasure of the selected page. This is because of the fact that even though the wordlines in the non-selected pages are grounded, the $+5.0$ volts applied to the source regions of the selected page is done through a common source line which is tied to the source regions of all transistor cells in the flash EEPROM array. Accordingly, the erase disturb will be generated in the array.

Moreover, it has been suggested in the '808 patent that a VCC level of $+5.0$ volts could be applied to all of the wordlines in the non-selected pages in order to eliminate completely this erase disturb (disturbing the charge stored on the floating gate). However, this technique created in turn a drawback which arises from the fact that the power dissipation per cell is increased since the capacitance of the control gate and source region must be charged and discharged. As a result, the power requirement of a memory array having one million or more memory cells (a megabyte chip) would be increased substantially. A second drawback in this prior art technique is encountered due to the cycling of charge back and forth on the transistor memory cells in the unselected sectors which will reduce its wear characteristics and eventually leads to physical damage.

In co-pending and commonly assigned U.S. application Ser. No. 07/964,807, now U.S. Pat. No. 5,282,170, to M. A. Van Buskirk et al. entitled "Negative Power Supply" and filed on Oct. 22, 1992, there is disclosed a negative power supply for generating and supplying a regulated potential to control gates of selected memory cell transistors through the wordlines during the flash erase mode of operation. This application Ser. No. 07/964,807, now U.S. Pat. No. 5,282,170 is also hereby incorporated by reference in its entirety. In FIG. 1 of the '807 application, there is shown a block diagram of the negative power supply 10 which includes an array VSS circuit 22 which is used to supply a VCC level of $+5.0$ volts to the source regions of the selected memory cells during erasure. A schematic circuit diagram of the array VSS circuit 22 is illustrated in FIG. 9 of the '807 application. The array VSS circuit 22 is used once for the entire memory array and provides only one global ground line VSS for the array. Accordingly, the same drawbacks discussed heretofore with respect to the '808 patent are likewise encountered in the '807 application.

The present invention represents a significant improvement over the prior art techniques of utilizing a single global ground line VSS for the memory array shown in the respective '808 patent and '807 application discussed above. The present invention includes a plurality of ground line circuits each generating a half-sector ground line signal. The source regions of all the memory cell transistors in each half-sector are connected to a separate independent ground line. Each of the separate independent ground lines is connected to one of the corresponding ground line circuits for receiving the associated half-sector ground line signal which is at a predetermined positive potential during flash erasure.

SUMMARY OF THE INVENTION

Accordingly, it is a general object of the present invention to provide an improved architecture for an array of flash EEPROM cells with paged erase, but yet overcomes the disadvantages of the prior art paged erase architectures.

It is an object of the present invention to provide an improved architecture for an array of flash EEPROM cells with paged erase which include multiple independent array ground line circuits so as to provide greater endurance as well as enhanced performance.

It is another object of the present invention to provide an improved architecture for an array of flash EEPROM cells with paged erase which includes a plurality of ground line circuits each associated with a half-sector for generating a half-sector ground line signal which is at a predetermined positive potential during flash erasure.

It is still another object of the present invention to provide an improved architecture for an array of flash EEPROM cells with paged erase wherein a ground line circuit in each half-sector is used for generating a half-sector ground line signal and wherein a separate individual ground line is connected to the sources of the memory cell transistor in each half-sector and to the corresponding ground line circuit for receiving the half-sector ground line signal.

In accordance with these aims and objectives, the present invention is concerned with the provision of a semiconductor integrated circuit memory device having array means formed of a plurality of half-sectors. Each of the plurality of half-sectors includes a plurality of memory cells arrayed in rows of word lines and columns of bit lines intersecting the rows of word lines. Each of the memory cells includes a floating gate transistor having a source, a drain, a floating gate, and a control gate. Each of a plurality of half-sector bit lines is connected to the drain of a memory cell in each of the rows so that the memory cells connected to the half-sector bit line form a column and the memory cells in the columns are connected to the half-sector bit line in parallel. There is provided means operatively coupled to the plurality of half-sector bit lines for selecting a half-sector.

The control gates of the memory cells in each of the rows are connected to one of the word lines. The sources of the memory cells are connected to a separate individual ground line. A ground line circuit is provided for generating a half-sector ground line signal. The non-selected sectors in the plurality of sectors are unaffected during flash erasure operation on the selected sector. The separate individual ground line is connected to the ground line circuit for receiving the half-sector ground line signal.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 2 is a detailed schematic circuit diagram of the array VSS circuit of FIG. 1;

FIG. 3 is a schematic circuit diagram of one of the half-sector ground line circuits, constructed in accordance with the principles of the present invention.

DESCRIPTION OF THE PREFERRED EMBODIMENT

Figure 1:
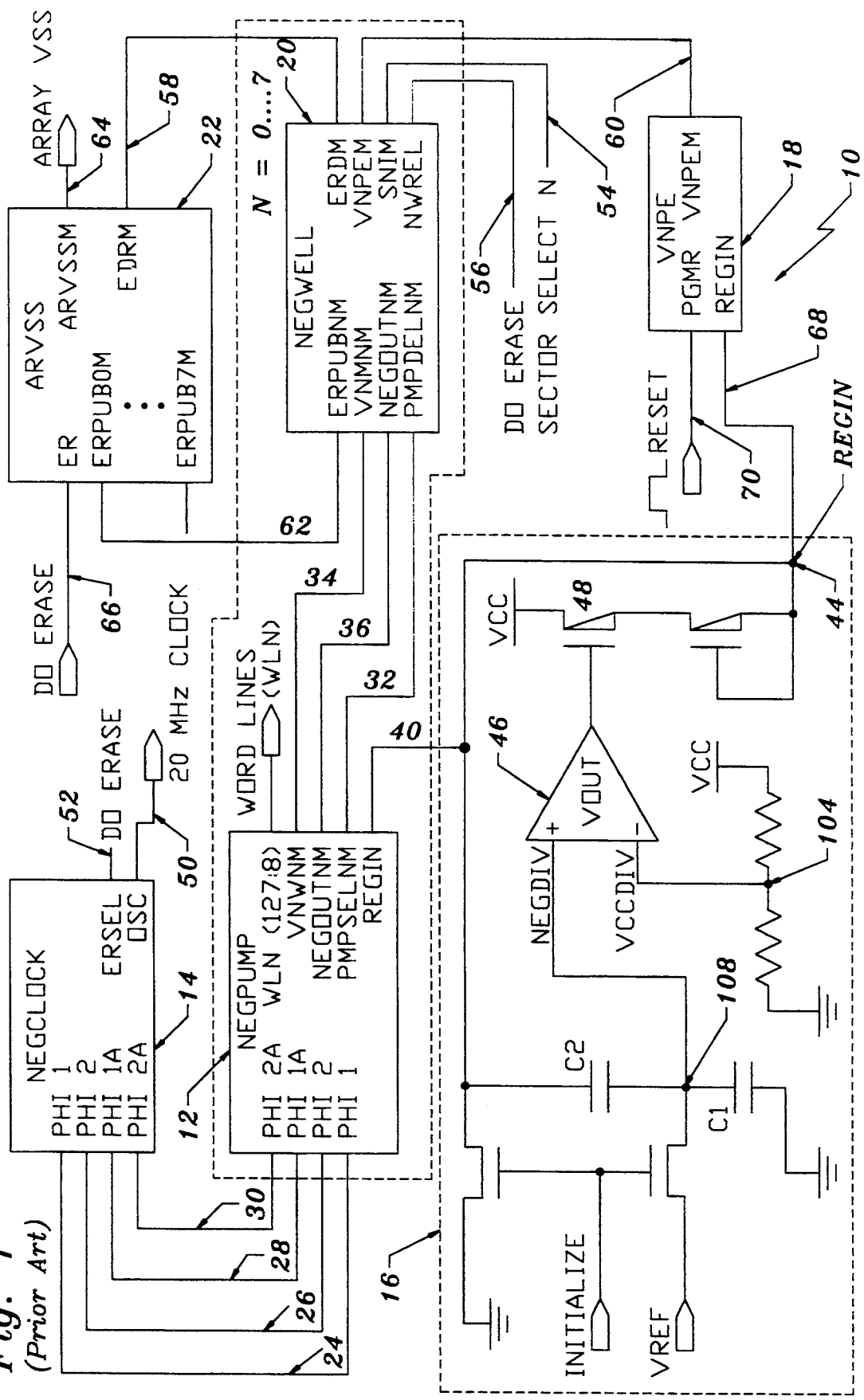
FIG. 1 is a block diagram of a negative power supply having an array VSS circuit of the prior art.

Referring now in detail to the drawings, there is shown in block diagram form in FIG. 1, which corresponds to FIG. 1 of the aforementioned '807 application, a prior art negative power supply 10 for generating and supplying a regulated negative potential to control gates of selected memory cell transistors through the word lines during the flash erase mode of operation. The negative power supply 10 is formed as a part of a single integrated circuit chip (not shown) which contains an array having a large number of flash EEPROM memory cells arranged in an N×M matrix. An external or off-chip power supply potential VCC (also not shown), which is typically at +5.0 volts, is supplied to the integrated circuit chip and is fed to the input of the negative power supply 10. The array of the flash EEPROM memory cells is formed on a substrate to define columns and rows, where the substrate includes a common source line extending along at least one of the rows and a plurality of bit lines extending along the respective columns. Each of the memory cells includes an N-type source region coupled to a common source line, a control gate, a floating gate, a channel region and an N-type drain region coupled to a respective one of the bit lines. Further, each of the memory cells is programmable predominately by transferring hot electrons into its floating gate and is erasable predominately by tunneling electrons from its floating gate to its source region.

The negative power supply 10 of FIG. 1 includes a P-channel charge pump circuit 12 for generating a relatively high negative potential NEGOUT on line 36 in response to a four-stage negative clock circuit 14. The power supply 10 also includes a negative regulator circuit 16 for adjusting the high negative voltage with respect to the external power supply voltage VCC and a protection circuit 18 for protecting the oxide of the P-channel pull-up device in a negative well circuit 20, which is used to generate the negative well voltage VNW on line 34. Further, the negative power supply includes an array VSS circuit 22 for generating an array VSS signal on line 64. The array VSS signal supplies 5.0 volts to the source regions of the selected memory cells during erasure.

It should be noted that where the memory array is, for example, physically arranged in a matrix of 1024 rows by 1024 columns, a predetermined number of rows may be grouped together so as to form a sector defining a page-selectable erase block. For instance, the 1024 rows may be divided into 8 sectors with each sector being composed of an equal number of rows (128 each). However, it should be apparent to those skilled in the art that each sector could be formed with an unequal number of rows. Further, the columns may be broken into segments so that each sector has a left side and a right side.

Accordingly, it can be seen that the pump circuit 12 and the negative well circuit 20 within the dotted lines are repeated sixteen times, one being formed on each side (left and right) for each of the eight sectors. The reference label n is equal to 0, 1, . . . 7 and the reference label m is equal to L (left) or R (right). However, the array VSS circuit 22 is repeated only once, one being formed for the 8 left sectors and one being formed for the 8 right sectors.

The array VSS circuit of FIG. 1 receives the erase control signal DO ERASE on line 66, which is connected to the node ER. The array VSS circuit further includes input nodes ERPUBɸM through ERPUB7M which are connected to other corresponding output signals on other negative well circuits similar to the output signal on the node ERPUBNM via the line 62.

The array VSS circuit 22 generates on its output the array VSS signal on the line 64.

In FIG. 2, there is shown a detailed schematic circuit diagram of the array VSS circuit 22 of FIG. 1. The array circuit 22 has a plurality (eight) of P-channel erase pull-up transistors P900–P907. Each one of the transistors P900–P907 is associated with one of the eight sectors in a particular half of the array. The sources of the transistors P900–P907 are connected to the power supply potential VCC. The gates of these transistors are connected to receive a respective one of the decoding signals ERPUB$\phi$m–ERPUB7m. The drains of the transistors are coupled to a common node 116 via a respective one of the load resistors R900–R907. The node 116 provides the array signal ARVSSm.

During non-erase modes of operation, all of the decoding signals ERPUB$\phi$m–ERPUB7m will be high so that all of the transistors P901–P907 are turned off. Further, the erase signal ER will be low during non-erase modes so that the output of the NOR gate will be high thereby turning on the pull-down transistor N901. As a result, the array signal ARVSSm is grounded. It will be recalled that in this prior art technique all of the sources of the flash EEPROM cells in each half of the array are commonly tied together and are connected to receive this array signal ARVSSm.

During the erase mode, the erase signal ER will be high so that the output of the NOR gate will be low which turns off the pull-down transistor N901. Accordingly, when any one of the eight sectors in the half of the array is selected during the erase mode its corresponding decoding signal will be low which turns on its associated erase pull-up transistor. As a consequence, the array signal ARVSSm will be pulled to the power supply potential VCC so that the sources of the memory cells in the selected sector of the array half will have +5.0 volts applied thereto during erase. However, this has the undesirable effect of applying also the same +5.0 volts to all of the sources of the memory cells in the non-selected sector in the array half as well. This subjects the cell transistors to increased cycling of charge back and forth which reduces its endurance and deteriorates its performance.

In order to overcome the undesirable effect of cycling charge, the present invention replaces the global-type of array VSS circuit 22 with a plurality of half-sector based array ARVSSnm ground line circuits 322. Each of the array ARVSSnm ground line circuits is used for generating an individual half-sector ground line signal so that the source regions of the memory cells in the unselected path sectors will be retained at a ground potential during erasure. In particular, in the instance where the memory array is divided into 16 half-sectors (eight half-sectors on each left and right sides), there would be provided sixteen such array ARVSSnm ground line circuits 322 each being associated with one of the corresponding half-sectors. A detailed schematic circuit diagram of one of the half-sector-based array ARVSSnm circuits 322 is depicted in FIG. 3.

The array ARVSSnm circuit 322 includes inverter gates 324, 326; a NAND logic gate 328; P-channel MOS transistors P330–P334; N-channel MOS transistors N336–N340; and a resistor R342. The NAND logic gate 328 has its first input connected to a first input terminal 344 of the ground line circuit 322 so as to receive a half-sector select signal Sn$\phi$m. The NAND gate has second input coupled to a second input terminal 346 of the ground line circuit via the inverter gate 324 to receive the N-well voltage VNWnm. The output terminal 348 is used to generate the separate individual half-sector ground line signal ARVSSnm for the half-sector of the array.

During non-erase operations, the half-sector select signal Sn$\phi$m will be at a low logic level and the N-well voltage VNWnm will be at a high logic level. This causes the output of the NAND gate 328 go high which, in turn, renders the transistor P330 to be conductive and the transistor N336 to be non-conductive. As a result, the output pull-down transistor N340 will be turned on and the output pull-up transistor P334 will be turned off. Thus, the separate individual ground line signal ARVSSnm will be low.

During the erase mode of operation, the negative well voltage VNWnm will go to a low logic level. Also, the half-sector select signal Sn$\phi$m will go high only if the half-sector has been selected. For the selected half-sectors, the output of the NAND gate 328 will change to a low logic level. This will cause the transistor N336 to be conductive and the transistor P330 to be nonconductive. Consequently, the output pull-down transistor N340 will be turned off and the output pull-up transistor will be turned on. Accordingly, the signal ARVSSnm will go high for only the selected half-sectors. The resistance of the transistor P332 and N338 and the gate capacitance of the transistor P334 serve to insure that the transistor N340 turns off first before the transistor P334 turns on so as to avoid a crow bar current effect.

It should be understood that since the half-sector select signal will be low for the non-selected half-sectors, the output of the NAND gate 328 in the array ground line circuit 322 for the non-selected half-sectors will remain at the high logic level. Therefore, the separate individual ground line signal ARVSSnm for the unselected half-sectors will be maintained at a ground potential. Unlike the prior art technique of raising the gate of the memory cells in the non-selected half-sectors so as to eliminate gate disturb, it is no longer necessary to do so in the present invention since the gate can also remain grounded during erase for the non-selected half-sectors. In this manner, the undesirable effects of cycling have been eliminated during erase.

Figure 4:
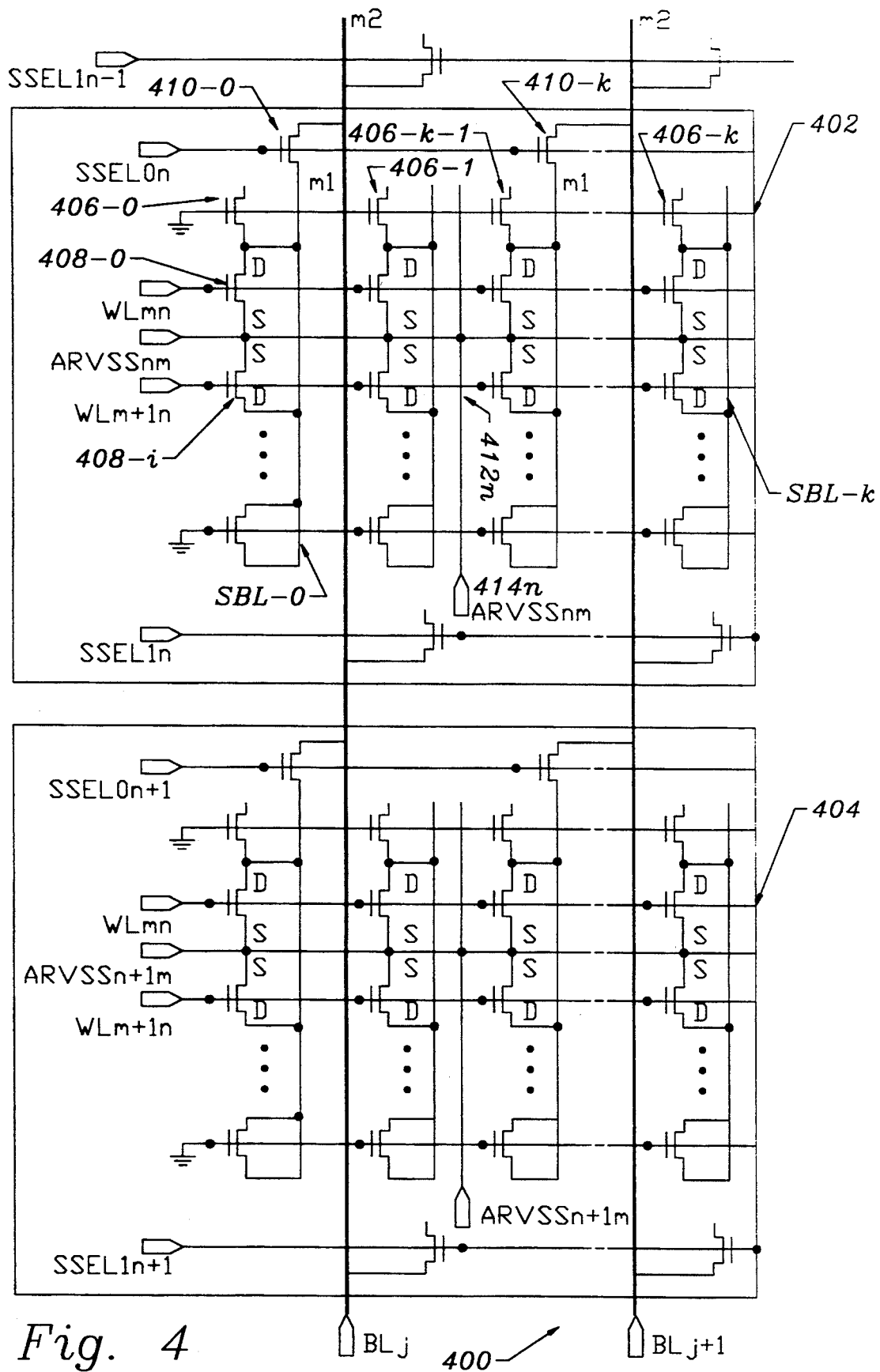
FIG. 4 illustrates two sectors of a flash EEPROM memory cell array utilizing the architecture of the present invention.

In FIG. 4, there is shown a schematic circuit diagram of two half-sectors of a flash EEPROM memory cell array which utilizes the architecture of the present invention. The two half-sectors 402 (sector n) and 404 (sector n+1) are arranged in a flash EEPROM memory cell array 400. Since each of the sectors 402 and 404 are identical in their construction, it will be sufficient to describe only the sector 402. The sector 402 includes a multiplicity of flash EEPROM cells arrayed in columns 406-0 to 406-k and in rows 408-0 to 408-i. Each of the flash EEPROM cell transistors includes a source, a drain, a floating gate, and a control gate. In the sector 402, there is provided a plurality of word lines WL which are coupled to the gates of the flash EEPROM cells in that sector. For example, within the row 408-0 a word line WLnm is connected to the control gates of the EEPROM cells in that row.

The sector 402 also includes a multiplicity of half-sector select transistors 410-0 to 410-k which are arranged in row p. The number of select transistors corresponds to the number of columns. Each of the select transistors has a drain, a source, and a gate. In the row p, the gates of the select transistors are connected together to receive the common half-sector select signals SSEL$\phi$n which corresponds to the signal Snφm in FIG. 3. The drain of each select transistor is connected to an array bit line which is associated with the column in the half-sector in which the select transistor is contained. For example, the drain of the select transistor 410-0, which is associated with the column 406-0, is connected to the array bit line BLj. The drains of the flash EEPROM cells in each column 406-0 to 406-k are connected to associated sector bit lines SBL-0 to SBL-k. The sector bit lines are also connected to the sources of the associated select transistor 410-0 to 410-k. Unlike the prior art flash EEPROM array architecture, all of the sources S of the flash EEPROM cells within the half-sector 402 are tied together and to a separate independent or individual half-sector ground line 412n.

For example, the separate individual ground line 412n is connected to all of the sources of the cells in the sector 402 (sector n) and to an internal node 414n. Node 414n receives the individual ground line signal ARVSSnm from the array ARVSSnm ground line circuit 322 of FIG. 3. Accordingly, the individual ground line signal ARVSSn can be raised to +5.0 volts during erase if the half-sector 402 is selected without disturbing of the other non-selected sectors. In other words, a non-selected sector will have its corresponding separate ground line signal remain at a grounded potential.

From the foregoing detailed description, it can thus be seen that the present invention provides an improved architecture for an array of flash EEPROM cells with paged erase. The array is formed of a plurality of half-sectors. In each half-sector, the sources of the memory cell transistors are connected to a separate individual ground line. A ground line circuit is provided for generating a half-sector ground line signal. The separate individual ground line is connected to the ground line circuit for receiving the half-sector ground line signal.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. In a semiconductor integrated circuit memory device having array means formed of a plurality of half-sectors, each of said plurality of half-sectors (402, 404, . . . ) comprising:

a plurality of memory cells arrayed in rows (408-0 . . . 408-i) of word lines and columns (406-0 . . . 406-k) intersecting said rows of word lines, each of said memory cells including a floating gate transistor having a source, a drain, a floating gate, and a control gate;

a plurality of half-sector bit line means each (SBL-0 . . . SBL-k) of said half-sector bit line means being connected to the drain of a memory cell in each of said rows so that said memory cells connected to said each half-sector bit line means form a column and said memory cells in said columns are connected to said plurality of half-sector bit line means in parallel;

means (410-0 . . . 410-k) operatively coupled to said plurality of half-sector bit line means for selecting a half-sector;

said control gates of said memory cells in each of said rows being connected to one of said word lines, said sources of said memory cells being connected to a separate individual ground line (412n);

ground line circuit means (322) for generating a half-sector ground line signal (ARVSSnm), the non-selected sectors in said plurality of sectors being unaffected during erase operation on said selected sector; and said separate individual ground line being connected to said ground line circuit means for receiving said half-sector ground line signal.

2. In a semiconductor integrated circuit memory device as claimed in claim 1, wherein said ground line circuit means is responsive to a half-sector select signal so as to generate the half-sector ground line signal which is at a predetermined positive potential during erase upon selection of said half-sector.

3. In a semiconductor integrated circuit memory device as claimed in claim 2, wherein said half-sector ground line signal is at a ground potential during erase upon non-selection of said half-sector.

4. In a semiconductor integrated circuit memory device as claimed in claim 1, wherein said means for selecting a half-sector comprises a plurality of half-sector select transistors, each transistor having a source, a drain, and a gate.

5. In a semiconductor integrated circuit memory device as claimed in claim 4, wherein each of said half-sector bit line means is connected to a source of one of said half-sector select transistors.

6. In a semiconductor integrated circuit memory device as claimed in claim 5, wherein said gates of said half-sector select transistors are connected to receive a half-sector select signal.

7. In a semiconductor integrated circuit memory device as claimed in claim 2, wherein said predetermined positive potential is approximately +5.0 volts.

8. In a semiconductor integrated circuit memory device as claimed in claim 1, further comprising negative supply means for generating and supplying a relatively negative potential to said control gates of said memory cells in the selected sector during erase.

9. In a semiconductor integrated circuit memory device as claimed in claim 8, wherein said negative potential is approximately −12.0 volts.

10. In a semiconductor integrated circuit memory device having array means formed of a plurality of half-sectors (402,404 . . . ), each of said plurality of half-sectors comprising:

a plurality of memory cells arrayed in rows (408-0 . . . 408-i) of word lines and columns (406-0 . . . 406-k) intersecting said rows of word lines, each of said memory cells including a floating gate transistor having a source, a drain, a floating gate, and a control gate;

a plurality of half-sector bit line means (SBL-0 . . . SBL-k) each of said half-sector bit line means being connected to the drain of a memory cell in each of said rows so that said memory cells connected to said each half-sector bit line means form a column and said memory cells in said columns are connected to said plurality of half-sector bit line means in parallel;

means (410-0 . . . 410-k) operatively coupled to said plurality of half-sector bit line means for selecting a half-sector;

said control gates of said memory cells in each of said rows being connected to one of said word lines, said sources of said memory cells being connected to a separate individual ground line (412n);

a plurality of ground line circuit means (322) for generating multiple half-sector ground line signals (ARVSSnm), the non-selected sectors in said plurality of sectors being unaffected during erase operation on said selected sector; and said separate individual ground line being connected to an associated one of said plurality of ground line circuit means for receiving a corresponding one of said multiple half-sector ground line signals.

11. In a semiconductor integrated circuit memory device as claimed in claim 10, wherein each of said plurality of ground line circuit means is responsive to a corresponding half-sector select signal so as to generate the corresponding one of the multiple half-sector ground line signals which is at a predetermined positive potential during erase upon selection of said half-sector.

12. In a semiconductor integrated circuit memory device as claimed in claim 11, wherein each of said multiple half-sector ground line signals is at a ground potential during erase upon non-selection of said half-sector.

13. In a semiconductor integrated circuit memory device as claimed in claim 10, wherein said means for selecting a half-sector comprises a plurality of half-sector select transistors, each transistor having a source, a drain, and a gate.

14. In a semiconductor integrated circuit memory device as claimed in claim 13, wherein each of said half-sector bit line means is connected to a source of one of said half-sector select transistors.

15. In a semiconductor integrated circuit memory device as claimed in claim 14, wherein said gates of said half-sector select transistors are connected to receive a half-sector select signal.

16. In a semiconductor integrated circuit memory device as claimed in claim 11, wherein said predetermined positive potential is approximately +5.0 volts.

17. In a semiconductor integrated circuit memory device as claimed in claim 10, further comprising negative supply means for generating and supplying a relatively negative potential to said control gates of said memory cells in the selected sector during erase.

18. In a semiconductor integrated circuit memory device as claimed in claim 17, wherein said negative potential is approximately −12.0 volts.

19. In a semiconductor integrated circuit memory device having array means formed of a plurality of half-sectors, each of said plurality of half-sectors including a plurality of memory cells arrayed in rows of word lines and columns of bit lines intersecting said rows of word lines, each of said memory cells including a floating gate, a control gate, a source region connected to a separate independent ground line, and a drain region coupled to a respective one of the bit lines, and where each memory cell is programmable predominately by transferring hot electrons into its floating gate and is erasable predominately by tunneling electrons from its floating gate to its source region, each of said plurality of half-sectors comprising:

said control gate of each memory cell receiving a relatively negative potential during flash erasure; and ground line circuit means (322) for generating a half-sector ground line signal, (ARVSSnm) said separate independent ground line (412n) being connected to said ground line circuit means for receiving said half-sector ground line signal.

20. In a semiconductor integrated circuit memory device as claimed in claim 19, wherein said half-sector ground line signal is at a predetermined positive potential during erase upon selection of a half-sector and is at a ground potential during erase upon non-selection of said half-sector.

* * * * *

UNITED STATES PATENT AND TRADEMARK OFFICE
CERTIFICATE OF CORRECTION

PATENT NO. : 5,365,484

DATED : November 15, 1994

INVENTOR(S) : Lee E. Cleveland et al.

It is certified that error appears in the above-indentified patent and that said Letters Patent is hereby corrected as shown below:

Column 4, line 38, "5.0", should be -- +5.0 --;

line 65, "ERPUBϕM", should be -- ERPUBØM --.

Column 5, line 12, "ERPUBϕM", should be -- ERPUBØM --;

line 67, "Snϕm", should be -- SnØm --.

Column 6, line 7, "Snϕm", should be -- SnØm --;

line 18, "Snϕm", should be -- SnØm --;

line 68, "SSELϕn", should be -- SSELØn --.

UNITED STATES PATENT AND TRADEMARK OFFICE
CERTIFICATE OF CORRECTION

PATENT NO. : 5,365,484
DATED : November 15, 1994
INVENTOR(S) : Lee E. Cleveland et al.

It is certified that error appears in the above-indentified patent and that said Letters Patent is hereby corrected as shown below:

Column 7, line 1, "Snϕm", should be -- SnØm --;

line 63, after "means", insert -- , --.

Column 8, line 64, before "each", insert -- , --.

Column 10, line 32, delete "," after "signal" and insert -- , -- before "said".

Signed and Sealed this

Seventh Day of February, 1995

Attest:

BRUCE LEHMAN

*Attesting Officer*      *Commissioner of Patents and Trademarks*